United States Patent [19]

Srivastava et al.

[11] Patent Number: 5,001,448

[45] Date of Patent: Mar. 19, 1991

[54] SHIELD FOR A MAGNET

[75] Inventors: Vishnu C. Srivastava; John J. Wollan; Robert R. Carey, all of Florence, S.C.

[73] Assignee: General Electric Company, Milwaukee, Wis.

[21] Appl. No.: 452,087

[22] Filed: Dec. 18, 1989

[51] Int. Cl.⁵ .............................................. H01F 7/00
[52] U.S. Cl. .................................... 335/301; 324/318
[58] Field of Search ...................... 335/299, 301, 216; 324/318, 319, 320

[56] References Cited

U.S. PATENT DOCUMENTS

| | | | |
|---|---|---|---|
| 4,822,772 | 4/1989 | Huson | 335/301 X |
| 4,931,760 | 6/1990 | Yamaguchi et al. | 335/299 X |
| 4,937,545 | 6/1990 | Chaillout et al. | 335/301 X |

Primary Examiner—George Harris
Attorney, Agent, or Firm—James O. Skarsten; Douglas E. Stoner

[57] ABSTRACT

A shield is provided for a magnet of the type used in magnetic resonance imaging or spectroscopy to limit the fringe field of a superconducting magnet to specified boundaries when the magnet is generating a magnetic field having a strength required for normal magnet operation. The shield includes a number of steel rectangular plates position around the magnet to form respective sides of a shield, the shield having a cross section in the form of a polygon such as a octrahedron. End caps having the shape of such polygon are joined to the ends of the plates. Structure is provided for supporting the magnet for movement as an integral unit relative to the shield. The supporting structure includes a first set of adjusting mechanisms for moving the magnet vertically and a second set of adjusting mechanisms for moving the magnet laterally, relative to the shield, to move the axis of the magnet into alignment with the shield axis, to avoid magnet quenching and inhomogeneities in the field generated by the magnet.

16 Claims, 2 Drawing Sheets

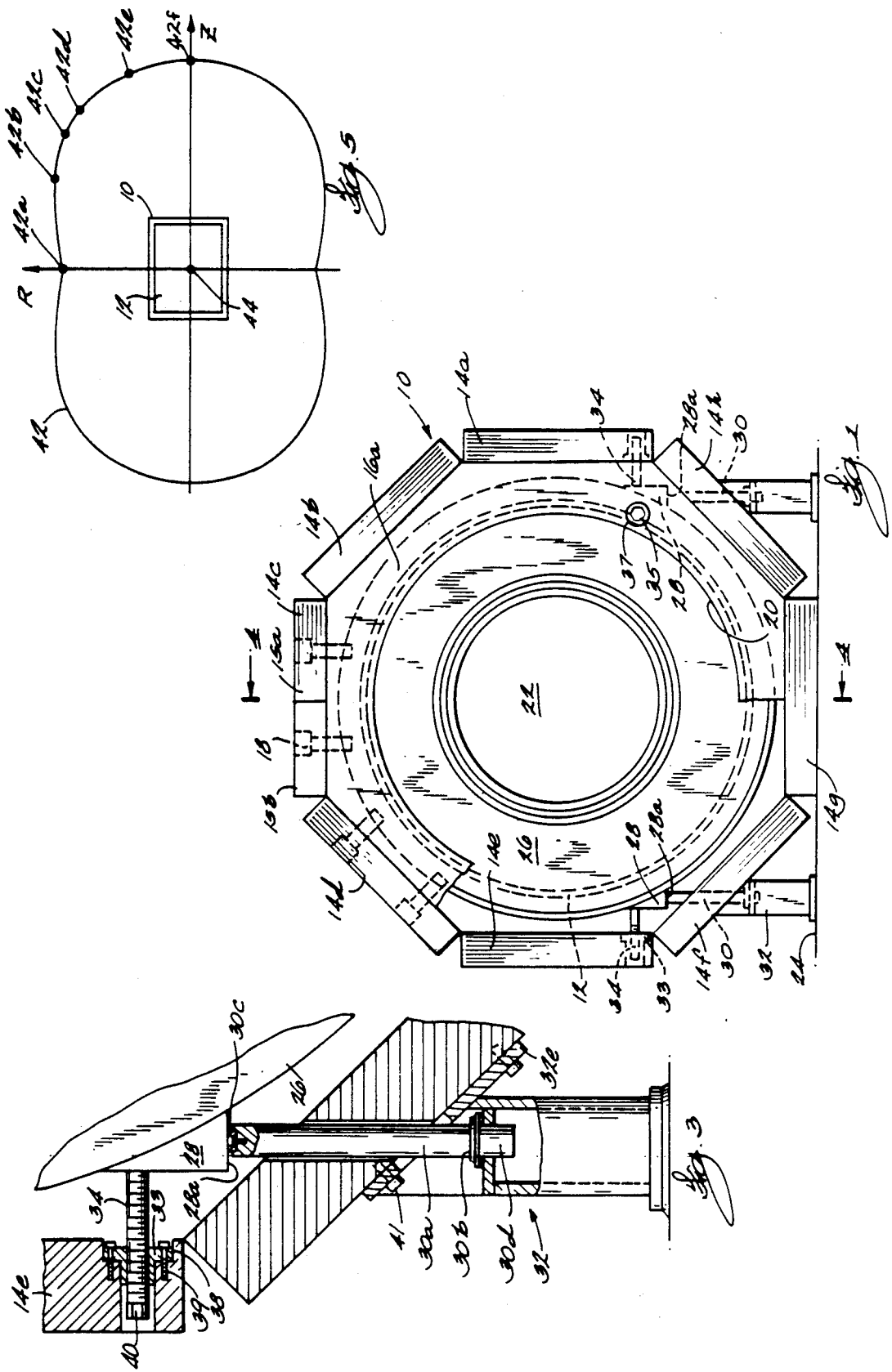

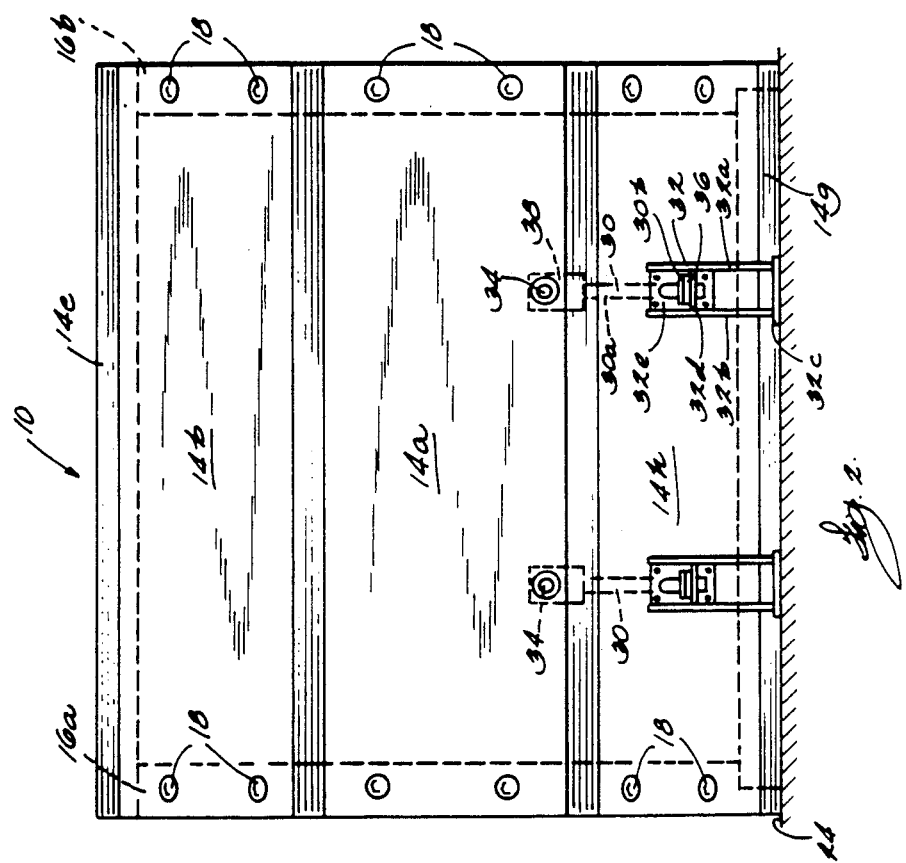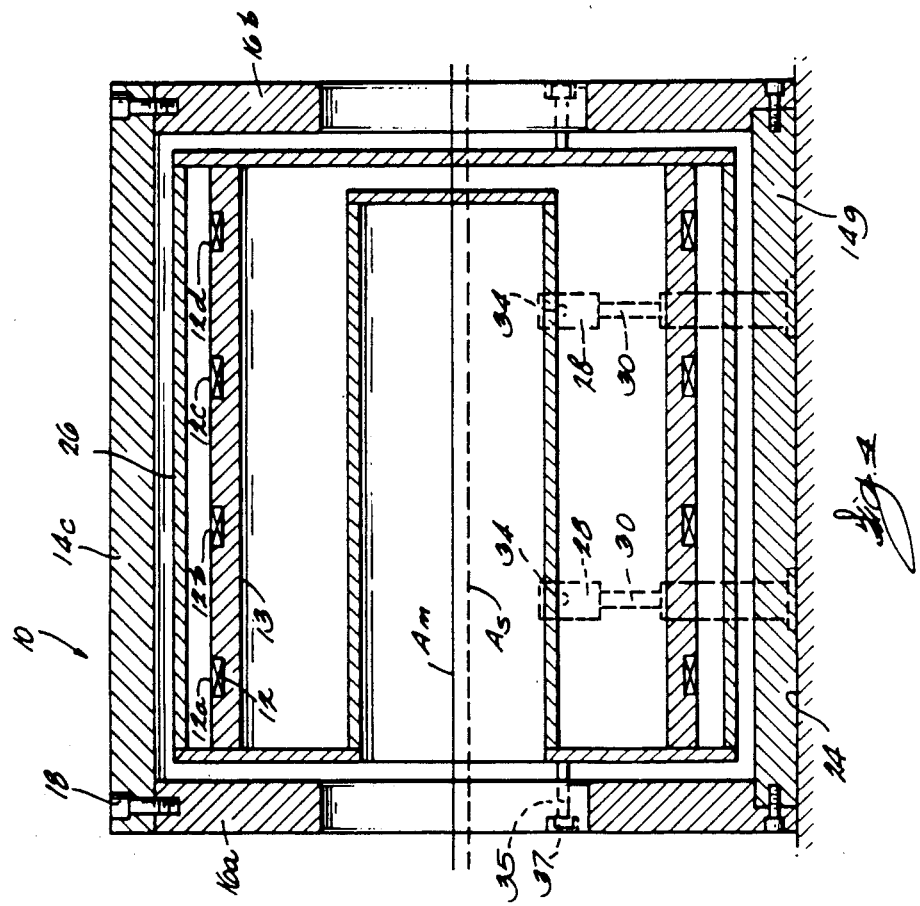

SHIELD FOR A MAGNET

BACKGROUND OF THE INVENTION

The invention disclosed and claimed herein generally pertains to a shield for a magnet. More particularly, the invention pertains to a passive magnetic shield for use with the type of magnet employed in magnetic resonance imaging or spectroscopy to generate the main magnetic field.

As is well known, magnetic resonance imaging requires the use of a magnet for generating a very strong magnetic field, which may be on the order of 1.5 Tesla, in a hospital or like environment. Such magnets, sometimes referred to as main magnets, typically comprise a number of magnetic coils supported along a cylindrical frame around a bore which is of sufficient size to receive a human patient. In some arrangements, the coils are maintained at an extremely low temperature so that the conducting material forming the coils operates in a superconducting mode. External power requirements for a main magnet are thereby minimized.

The strong magnetic field generated by the main magnet includes a fringe field, or field component extending into the space around the magnet. The fringe field may be strong enough to interfere with the operation of electronic devices such as pacemakers or other equipment of a medical nature which must be operated in the vicinity of the magnet. Accordingly, various practices have been followed or proposed to prevent the fringe field from exceeding a threshold level beyond a specified distance from the main magnet. Five Gauss has typically been selected as the threshold value, and the term "Five Gauss line" refers to a boundary within which the fringe field exceeds 5 Gauss.

In some hospitals, adverse effects of fringe fields are avoided by lining a room containing an MRI system with steel shielding, or by locating the system in its own specially constructed building. Such approaches tend to involve great cost. In other approaches to limiting fringe fields, shielding material is placed around the main magnet, in close proximity thereto. One such arrangement is shown in U.S. Pat. No. 4,758,812, issued July 19, 1988 to Forster et al. Forster discloses several alternative configurations of such magnet shields, respectively formed of beams, rods or plates. However, in some of such arrangements the shielding elements may have to be incorporated as an integral part of the main magnet. Because such elements tend to be bulky, heavy, or of odd design, magnet construction costs are significantly increased. Also, such arrangements cannot be used to provide shielding for already existing magnets, and may adversely affect the homogeneity of the magnetic field within the magnet bore, thereby introducing errors into the imaging process.

As a further drawback, prior-art shielding systems of the above type may impose non-uniform forces on the respective coils of a magnet. Thus, the coils are urged out of alignment with one another, so that their respective axes are no longer in colinear relationship. In a superconducting coil, the fields of misaligned coils tend to interfere with each other such that the coils heat and lose their superconductivity, or "quench." To prevent quenching, prior-art systems, as exemplified by Forster et al., provide devices for individually adjusting coils to ensure proper alignment. However, the adjusting process may be very tedious, and of limited effect.

SUMMARY OF THE INVENTION

The present invention provides a shield for a magnet having an associated magnet axis, such as a magnet used to generate the main magnetic field required for magnetic resonance imaging or spectroscopy. The shield includes a plurality of elongate members made of specified magnetic shielding material, and further includes means for supporting the elongate members to form respective sides of a substantially closed shield structure which surrounds the magnet and has an associated shield axis. Means are provided for supporting the magnet within the shield structure, and other means are coupled to the supporting means for moving the magnet as a unit relative to the shield structure to align the axis of the magnet in colinear relationship with the axis of the shield structure. The shield structure acts as a passive shielding device, i.e., it operates to selectively limit a magnetic field without the need to use external power to generate a countervailing field. Also, the shield has been designed to have minimal impact on homogeneity of the base magnet. Specifically, the bore on the end caps of the shield has been optimized to achieve this obejctive.

An object of the invention is to substantially reduce the fringe magnetic field adjacent to the main magnet of a magnetic resonance imaging system.

Another object is to provide a shield for such purpose which does not diminish the homogeneity of the magnetic field generated by the magnet.

Another object is to provide a shield of the above type for use with a magnet including a plurality of coils which eliminates the need to adjust the alignments of individual coils.

Another object is to provide a passive shield for a superconductor magnet which avoids magnet quenching.

Another object is to provide a passive shield for a magnet which may be readily employed with existing magnets.

Another object is to provide a passive shield for a magnet which is comparatively simple and inexpensive, and which does not impose special design requirements on the magnet.

An advantage of the invention lies in the ease of assembly of the shield thereof around a magnet.

Another advantage lies in the octahedral arrangement of plates used in forming the shield which results in uniform distribution of forces on respective coils of a multiple coil magnet used therewith, thereby eliminating need for supplemental support for the coils in order to operate satisfactorily with the shield.

These and other objects and advantages will become more readily apparent from the following description, taken in conjunction with the accompanying drawing.

BRIEF DESCRIPTION OF THE DRAWINGS

FIG. 1 is an end view of a magnetic shield constructed in accordance with the invention surrounding a superconductor magnet of a type used in magnetic resonance imaging, with a portion of the end cap of the shield broken away.

FIG. 2 is a side view of the embodiment of FIG. 1.

FIG. 3 shows a portion of the magnet positioning and adjusting mechanism employed in the embodiment shown in FIG. 1.

FIG. 4 is a sectional view taken along lines 4—4 of FIG. 1.

FIG. 5 is an overhead view of the embodiment of FIG. 1 showing the position of the 5 Gauss line, as referenced by orthogonal co-ordinates intersecting at the magnet center.

DETAILED DESCRIPTION OF THE PREFERRED EMBODIMENT

FIG. 1 shows a shield 10 constructed in accordance with the invention surrounding a magnet 12. Shield 10 generally comprises eight similar or identical rectangular plates 14a14 14h, an octahedral-shaped end cap or flange 16a, and another octahedral-shaped end cap 16b, identical to end cap 16a, which is not shown in FIG. 1. The ends of the plates 14a–14h are respectively joined to corresponding sides of the end caps 16a and 16b by means of bolts 18 or the like, in tight-fitting relationship. Side edges of adjacent plates extending between the two end caps are in abutting relationship, and V-shaped gaps are formed therebetween. Thus, the end caps 16a and 16b rigidly support the plates 14a–14h to form a shield structure which surrounds the magnet 12 and is closed except for opening 20 provided in end cap 16a (and 16b) to enable a patient or other object to be moved into or out of the bore 22 of the magnet 12. FIG. 1 shows the bottom-most plate 14g positioned directly on a floor or other supporting surface 24. Plates 14a–h are usefully formed of 1006 carbon steel.

Usefully, plate 14c comprises two sections 15a and 15b which are butted together along common edges extending longitudinally between end caps 16a and 16b. It has been found to be much more convenient to put plate 14c into position above magnet 12 if it is in two sections rather than in a solid piece.

Magnet 12 usefully comprises a superconducting magnet for use in magnetic resonance imaging, such as the magnet disclosed in U.S. Pat. No. 4,800,354, issued Jan. 24, 1989. Such magnet comprises a plurality of discrete magnet coils, supported in coaxial relationship on a coil form (not shown in FIG. 1) positioned around bore 22. The magnet coils and coil form are contained in a vessel (not shown) filled with liquid helium, the coils, coil form and helium vessel all being enclosed within a cryostat 26. The extreme cold of the liquid helium causes the main coils to become superconductive. Thus, when the coils are energized, a very strong magnetic field is generated. A component of this field resides in the bore 22, and another component radiates outwardly from the magnet. The field component within the bore is used for magnetic resonance imaging and may have a strength on the order of 1.5 Tesla.

FIG. 1 further shows support pads 28 respectively attached to the outer surface of cryostat 26. Each pad has a surface 28a in slidable contact with the upper end of a corresponding vertical support member 30, which traverses one of the plates 14f or 14h. Each support member 30 is carried upon a corresponding stand 32 which is positioned on floor 24 and rigidly attached to the shield. Thus, vertical support members 30 and stands 32 carry the entire weight of cryostat 26 and respective components contained therein, including magnet 12. All of such weight is transferred to the support members 30 through the surfaces 28a. At the same time, the slidable relationship between each pad surface 28a and its corresponding vertical support member 30 allows cryostat 26 and magnet 12 to move horizontally relative to members 30, stands 32 and shield 10.

As discussed hereinafter in conjunction with FIGS. 2 and 3, each of the vertical members 30 can be raised or lowered relative to its corresponding stand 32 to vertically adjust the position of magnet 12 relative to floor 24 and shield 10.

As described hereinafter in greater detail in conjunction with FIG. 3, FIG. 1 shows a plurality of adjustment screws 34, each in threaded engagement with a nut 33 secured to one of the plates 14a or 14e and bearing against a pad 28. Adjustment screws 34 are used to laterally shift cryostat 26 and magnet 12, i.e., to the left or right as viewed in FIG. 1. relative to shield 10.

As described hereinafter in conjunction with FIG. 4, two adjustment screws 35 are threaded through end cap 16a on opposite sides of bore 22 (only one screw 35 being shown in FIG. 1). Screws 35 are fitted into counterbores 37 in cap 16a and bear against the proximate end of cryostat 26. Two other screws 35 are correspondingly threaded through end cap 16b and bear against the opposing end of cryostat 26. The four adjustment screws 35 are used to shift cryostat 26 and magnet 12 axially relative to shield 10.

FIGS. 1 and 2 together show that a total of four sets of pads 28, support members 30, stands 32 and screws 34 are provided to selectively position cryostat 26 and thereby magnet 12.

FIG. 2 shows stands 32 each comprising two vertically oriented plates 32a and 32b which are spaced apart from each other in parallel relationship and rigidly joined to a base plate 32c in contact with floor 24. Plates 32a and 32b are rigidly tied together at their upper portions by means of a horizontally oriented web plate 32d and an angled plate 32e, each provided with an aperture.

FIG. 2 further shows each vertical support member 30 comprising a rod 30a bearing upon a flange member 30b. The aperture in a web plate 32d is sized to receive an end portion 30d extending below flange 30b and of integral construction therewith, so that the flange member 30b can be brought into contact with web 32d to provide a rigid interface therebetween. The downward loading imposed on a vertical support member 30 by cryostat 16 and magnet 12 contained therein is solidly taken up across such interface by the corresponding stand 32.

To increase the height of magnet 12 relative to shield 10, one or more shims 36 may be positioned between web plate 32d and flange 30b. The shims comprise rigid steel members of selected thickness, and are each provided with an aperture sized to allow traversal by the end portion 30d. The height of magnet 12 relative to floor 24 is usefully variable over a range on the order of 1.0 inches, according to the number and thickness of shims positioned between the flanges 30b and corresponding plates 32d.

FIG. 3 shows in greater detail an adjustment screw 34 in threaded engagement with a nut 33, which is immovably held in a counterbore 38 formed in one of the plates such as 14e such as by means of bolts 39. Adjustment screw 34 is provided with wrench flats 40 which may be engaged by a wrench to selectively rotate screw 34 and thereby urge the screw to bear against or to back away from an attachment structure 30. By cooperative adjustment of all the adjustment screws 34, cryostat 26 and magnet 12 can be displaced laterally over a range on the order of 1.0 inches.

FIG. 3 further shows the angled plate 32e of a stand 32 positioned at a 45 degree angle to vertical plates 32a and 32b, and attached to the shield 10 by means of bolts 41. A teflon or delrin pad 30c is usefully placed on the upper end of each rod 30a to allow the pad surface 28a in contact therewith to move freely relative thereto.

FIG. 4 shows magnet 12 comprising a plurality of circular coils 12a-12d, respectively wound upon a cylindrical coil form 13 which is rigidly supported by walls of cryostat 26. Coil form 13 maintains coils 12a-d in immovable relationship with one another, so that their respective axes are all aligned along a common axis $A_m$, the axis of magnet 12. It is to be understood that magnet 12 is shown to comprise four coils for purposes of illustration, but in fact could comprise a different number of coils.

Magnet axis $A_m$ must be aligned with the axis $A_s$ of shield 10 in order to ensure proper operation of magnet 12 when shield 10 is in place around cryostat 26. Misalignment between these axes can result in quenching of magnet 12, and can impact on the homogeneity of the magnetic field within bore 22 such that magnetic resonance imaging of an object in the bore is adversely affected. Since respective coils 12a-d of magnet 12 are rigidly joined to cryostat 26 through coil form 13, magnet axis $A_m$ is most effectively brought into alignment with shield axis $A_s$ by selective vertical and lateral displacement of cryostat 26, in view of the much greater weight of the shield. The required vertical displacement is within the range of variation which can be provided by means of shims 36. Similarly, the required lateral displacement is within the range of variation which can be provided by adjustment screws 34. Thus, by judicious selection of shims 36 positioned between stands 32 and members 28, and manipulation of screws 34, magnet axis $A_m$ can be aligned with shield axis $A_s$ to within 1/16 of an inch or less.

FIG. 4 further shows adjustment screws 35 traversing corresponding holes respectively formed through end caps 16a and 16b, and engaging threads of nuts respectively attached thereto such as nuts 33 shown in FIG. 3 in connection with screws 34. By manipulation of the adjustment screws 35, magnet 12 can be axially shifted relative to shield 10, i.e., shifted along axis $A_s$, over a range on the order of 1.0 inch.

For simplification, various components such as a liquid helium vessel have been deleted from the view of the interior of cryostat 26 as depicted in FIG. 4.

FIG. 5 shows a magnet 12 enclosed within shield 10 generating a 1.5 Tesla magnetic field and having a 5 Gauss line 42. Five Gauss line 42 is a curve generated to fit data points 42a-f, each of which was obtained by actual measurement of the fringe field generated by magnet 12 when enclosed by the shield 10. Five Gauss line 42 intersects an axis designated as the Z-axis, coinciding with the magnet axis $A_m$, at a distance of 19.5 feet from the magnet center. The Five Gauss line intersects an axis designated as the R-axis, orthogonal to the Z-axis, at a distance of 12 feet from the magnet center 44. Thus, if the magnet 12 was placed in the center of a room having dimensions on the order of 40 feet by 24 feet, the Five Gauss line would not extend outside of the room when the magnet generated a field on the order of 1.5 Tesla to perform magnetic resonance imaging.

While a preferred embodiment of the invention has been shown and described herein, it will be understood that such embodiment is provided by way of example only. Numerous variations, changes and substitutions will occur to those skilled in the art without departing from the spirit of the invention. For example, in some arrangements, the structure projects outwardly from the cryostat such that it is necessary to form openings in the shield to accommodate the structure. Accordingly, it is intended that the appended claims cover all such variations as fall within the spirit and scope of the invention.

What is claimed is:

1. Shielding apparatus for a magnet comprising a number of coils, each having an axis maintained along a common magnet axis, comprising:
   a plurality of elongate members formed of specified magnetic shielding material;
   means for supporting said elongate members to form respective sides of a shield structure surrounding said magnet and having a shield axis;
   means for supporting said magnet within said shield structure; and
   means coupled to said supporting means for adjusting the position of said magnet relative to said structure to selectively align said magnet axis with said shield axis.

2. The apparatus of claim 1 wherein said elongate member supporting means comprises:
   a first end member made of said specified magnetic shielding material having the shape of a polygon with a number of sides equal to the number of elongate members of said plurality; and
   means for joining each side of said polygon-shaped first end member to an end of one of said elongated members.

3. The apparatus of claim 1 wherein said elongate member supporting means further comprises:
   a second end member configured in the shape of said polygon; and
   means for joining each side of said polygon-shaped second end member to an end of one of said elongated members in opposing relationship to said first end member.

4. The apparatus of claim 3 wherein:
   said first and second end members are each configured in the shape of a regular octahedron.

5. The apparatus of claim 4 wherein:
   said specified shielding material comprises carbon steel.

6. The apparatus of claim 1 wherein:
   said elongate members comprise rectangular plates.

7. The apparatus of claim 1 wherein:
   said adjusting means comprises first and second adjusting mechanisms for respectively moving said magnet in first and second directions orthogonal to one another and to said shield axis.

8. The apparatus of claim 7 wherein:
   said first adjusting means comprises a set of adjusting screws.

9. The apparatus of claim 7 wherein:
   said magnet supporting means includes said second adjusting mechanism and respectively traverses openings formed through said shield for supporting said magnet independently of said shield.

10. The apparatus of claim 1 wherein:
    said adjusting means comprises first, second and third adjusting mechanisms for respectively moving said magnet in first, second and third directions orthogonal to one another, said first and second directions being orthogonal to said shield axis.

11. Shielding apparatus for a magnet having an axis comprising:
    a plurality of rectangular plates of specified magnetic shielding material;

means for joining said rectangular plates to form a polyhedral shell having an axis and opposing ends;

means for supporting said magnet within said shell; and means coupled to said supporting means for adjusting the position of said magnet as an integral unit relative to said shell to align the axis of said magnet along the axis of said shell.

12. The apparatus of claim 11 wherein:

said joining means comprises end members joined to said polyhedral shell at each of said ends to form an enclosed space.

13. The apparatus of claim 11 wherein:

said magnet supporting means comprises means for supporting said magnet upon a surface located external to said shell.

14. The apparatus of claim 12 wherein said magnet is a main magnet for magnetic resonance imaging having a bore for receiving an object which is to be imaged, and wherein:

an opening is formed in one of said end members to allow said object to be moved into and out of said bore.

15. The apparatus of claim 12 wherein:

said shell has an octahedral cross section and each of said end members has the shape of an octahedron corresponding to said octahedral cross section.

16. The apparatus of claim 11 wherein:

said magnet comprises a plurality of coils mounted in immovable relationship relative to one another.

* * * * *